(12) United States Patent
Wadhwa et al.

(10) Patent No.: US 11,757,455 B1
(45) Date of Patent: Sep. 12, 2023

(54) LOW JITTER DELAY CELL

(71) Applicant: QUALCOMM Incorporated, San Diego, CA (US)

(72) Inventors: Sameer Wadhwa, San Diego, CA (US); Lennart Karl-Axel Mathe, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 18/046,283

(22) Filed: Oct. 13, 2022

(51) Int. Cl.
*H03L 7/081* (2006.01)
*H03K 5/13* (2014.01)
*H03K 5/00* (2006.01)

(52) U.S. Cl.
CPC ............ *H03L 7/0818* (2013.01); *H03K 5/13* (2013.01); *H03K 2005/00019* (2013.01)

(58) Field of Classification Search
None
See application file for complete search history.

(56) References Cited

U.S. PATENT DOCUMENTS

| | | | |
|---|---|---|---|
| 8,149,038 B1* | 4/2012 | Sung | H03L 7/0814 327/158 |
| 8,487,800 B2* | 7/2013 | Wong | H03M 1/808 341/154 |
| 2013/0271305 A1* | 10/2013 | Kim | H03M 1/0863 341/154 |
| 2019/0212770 A1* | 7/2019 | Hashempour | H03K 3/017 |

* cited by examiner

*Primary Examiner* — Cassandra F Cox
(74) *Attorney, Agent, or Firm* — Norton Rose Fulbright US LLP (57) ABSTRACT

A delay cell for a delay locked loop, DLL, based serial link is disclosed. The delay cell has a first stage and a second stage, wherein an output of the first stage is an input to the second stage, the first stage comprising a resistive digital to analog converter, R-DAC and the second stage comprising a current starved delay cell.

30 Claims, 6 Drawing Sheets

Providing a first and a second stage wherein an output of the first stage is an input to the second stage, the first stage comprising a resistive digital to analog converter and the second stage comprising a current starved delay-cell.

Fig. 7

LOW JITTER DELAY CELL

BACKGROUND

Field of the Disclosure

Presented herein is an apparatus for a programmable low-jitter delay cell suitable for use, for example, with delay locked loop, (DLL) based serial links.

Description of Related Art

Delay-cell jitter can be a significant limiting factor for achieving high data rates in a DLL (Delay Locked Loop) based serial link design. CMOS Transistor channel thermal in the delay cell noise is the primary source of jitter. A typical solution to this problem is to provide a power-noise trade-off. This is generally achieved by burning more current in the devices to reduce jitter. However, this is at the expense of increased power consumption. Current solutions involve the use of current starved delay cells, supply tuned delay cells or analog replica cells, however these solutions are limited by MOS device thermal noise.

It is therefore desirable to provide a topology which provides improved low jitter performance at low power.

SUMMARY

A delay cell for a delay locked loop, DLL, based serial link is provided, comprising: a first stage and a second stage, wherein an output of the first stage is an input to the second stage, the first stage comprising a resistive digital to analog converter, R-DAC and the second stage comprising a current starved delay-cell.

This hybrid delay cell combines an inherent lower jitter delay generation using an RDAC with an area efficient delay configurability in a current starved delay cell. Combining the two provides for a low jitter configurable delay generation at low power.

The first stage may comprise a first field effect transistor, FET, and a second field effect transistor, FET and wherein a drain of the first transistor may be coupled to a drain of the second FET, and wherein a gate of the first FET is coupled to a gate of the second FET and to the input. This first stage provides a lower level of jitter than a device based delay cell.

The delay cell may further comprise a first resistor coupled in series between a first voltage level and the source of the first FET and a second resistor coupled in series between a source of the second FET and a second voltage level.

The first FET may be a pFET and the second FET may be a nFET.

This first stage provides fixed delay, coarse tuning, providing for low jitter and low noise. The first stage provides low noise performance.

The second stage may comprise n sections coupled in series, each section comprising: a third field effect transistor, FET, and a fourth field effect transistor, FET, wherein a drain of the third FET is coupled to a drain of the fourth FET and to an output of the section, and wherein a gate of the third FET is coupled to a gate of the fourth FET and to an input of the section.

The second stage may further comprise a fifth FET, wherein a drain of the fifth FET is coupled to a source of the third FET, wherein a source of the fifth FET is coupled to a first voltage level and wherein a gate of the fifth FET is coupled to a third voltage level.

The second stage may further comprise a sixth FET, wherein a drain of the sixth FET is coupled to a source of the fourth FET, wherein a source of the sixth FET is coupled to a second voltage level and wherein a gate of the sixth FET is coupled to a fourth voltage level.

The third FET and the fifth FET may be pFET and the fourth FET and sixth FET may be nFET.

The number of sections n, may be greater than or equal to 3. It will be appreciated that this allows for varying the delay provided.

The output of the second stage may be coupled to the output of the nth section and the input to the second stage may be coupled to the input of the first section of the n sections.

The second stage provides fine control with a programmable current starved delay cell for fine tuning. The combination of the first stage providing coarse tuning and second stage providing fine tuning optimizes the performance of the delay line. The hybrid combination provides lower jitter than a conventional current starved delay cell at comparable power in a comparable process, for example a 7 nm process.

The delay cell may further comprise an inverter coupled to an output of the second stage.

The delay cell may be manufactured in accordance with a 7 nanometer lithography process. It will however be appreciated that the topology is not restricted as such.

A method of providing a delay cell for use in a delay locked loop, DLL based serial link is claimed herein, comprising: providing a first stage and a second stage, wherein an output of the first stage is an input to the second stage, the first stage comprising a resistive digital to analog converter and the second stage comprising a current starved delay-cell.

The first stage may comprise a first field effect transistor, FET, and a second field effect transistor, FET and wherein a drain of the first FET is coupled to a drain of the second FET, and wherein a gate of the first FET is coupled to a gate of the second FET and to the input.

The above method may further comprise coupling a first resistor in series between a first voltage level and the source of the first FET and a second resistor (204) coupled in series between a source of the second FET and a second voltage level.

The first FET may be a pFET and the second FET may be a nFET.

The second stage may comprise n sections coupled in series, each section comprising: a third field effect transistor, FET, and a fourth field effect transistor, FET, wherein a drain of the third FET is coupled to a drain of the fourth FET and to an output of the section, and wherein a gate of the third FET is coupled to a gate of the fourth FET and to an input of the section.

The second stage may further comprise a fifth FET, wherein a drain of the fifth FET is coupled to a source of the third FET, wherein a source of the fifth FET is coupled to a first voltage level and wherein a gate of the fifth FET is coupled to a third voltage level.

The second stage may further comprise a sixth FET, wherein a source of the sixth FET is coupled to a drain of the fourth FET, wherein a drain of the sixth FET is coupled to a source of the fourth FET, wherein a source of the sixth FET is coupled to a second voltage level and wherein a gate of the sixth FET is coupled to a fourth voltage level.

The third FET and the fifth FET may be pFET and the fourth FET and sixth FET may be nFET.

The number of sections n, may be greater than or equal to 3.

Each section of the plurality of sections may be serially coupled such that the input of the second stage is the input to a first section of the plurality of sections and the output of the second stage is the output of a final section of the plurality of sections.

The method may further comprise coupling an inverter to the output of the second stage.

In a further configuration there is provided a delay lock loop, DLL comprising a plurality of delay cells having the features as outlined above.

In a further configuration there is provided a serial link comprising the delay lock loop according to the present invention.

DETAILED DESCRIPTION

Figure 1:
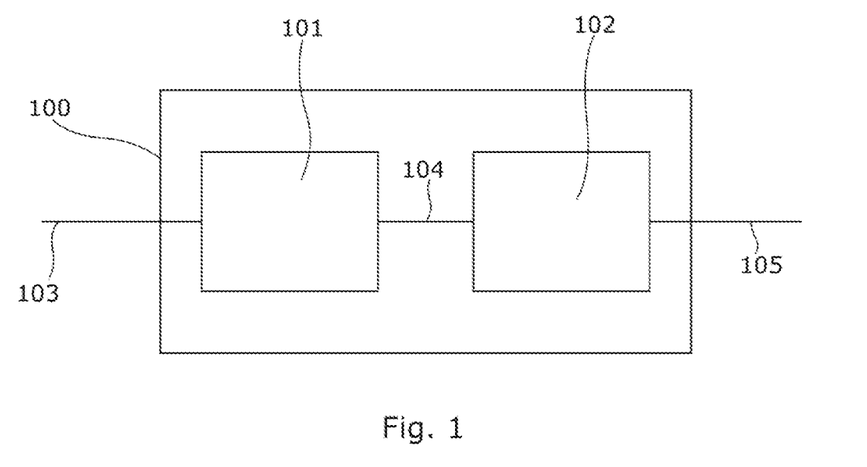
FIG. 1 is a block diagram of one example of a hybrid delay cell in accordance with the present invention

The invention will now be described with reference to the accompanying drawings. FIG. 1 is a representation of one example of a hybrid delay cell, 100. The hybrid delay cell, 100 comprises a first stage, 101 and a second stage 102 is serially coupled to the first stage. The output of the first stage 104 is an input to the second stage 102. In a preferred configuration, the first stage, 101 comprises a resistive digital to analog converter, R-DAC, 201. The second stage comprises a current starved delay cell, 301. Both the first and the second stages will be described in further detail below. The input to the first stage, 101 may be a clock signal. An output of the second stage is a delayed clock signal.

Figure 2:
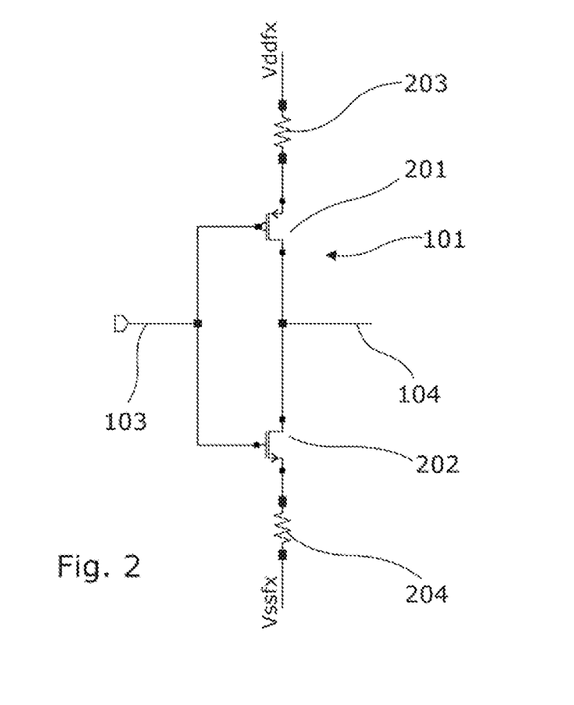
FIG. 2 is a circuit diagram representing an example first stage of a hybrid delay cell in accordance with the present invention FIG. 3 provides a number of alternative configurations for the first stage of a hybrid delay cell in accordance with the present invention.

An exemplary configuration for the first stage, 101 is shown in FIG. 2. The first stage, 101 comprises a first field effect transistor, FET, 201. A second FET, 202, is also provided. The drain of the first FET 201 is coupled to the drain of the second FET 202. The output 104 from the first stage, 101 is coupled to the drain of the first FET and the drain of the second FET. The gates of the first FET 201 and second FET 202 are coupled together and to an input 103. The first and second FETs form an inverter. A first resistor 203 is coupled to the source of the first FET 201. The first resistor 203 is coupled in series between a first voltage level, Vddfx, provided by a first voltage input (not shown), and the source of the first FET, 201. The first resistor 203 is a variable resistor. A second resistor, 204 is coupled to the source of the second FET 202. The second resistor 204 is coupled in series between the source of the second FET, 202, and a second voltage level, Vssfx. The second voltage level is provided at a second voltage input. The first FET is a pFET and the second FET is a nFET.

In one configuration Vssfx may be ground or 0V. Vddfx is a supply voltage and is variable depending on the relevant process technology used in the manufacture of the delay cell. For example for 6 nm to 14 nm processes Vddfx may be in the range of 0.7V to 0.9V.

While a single inverter section is shown in the first stage, 101, it will be appreciated that the inverter configuration may be replicated to provide n sections where n>1.

Figure 3:
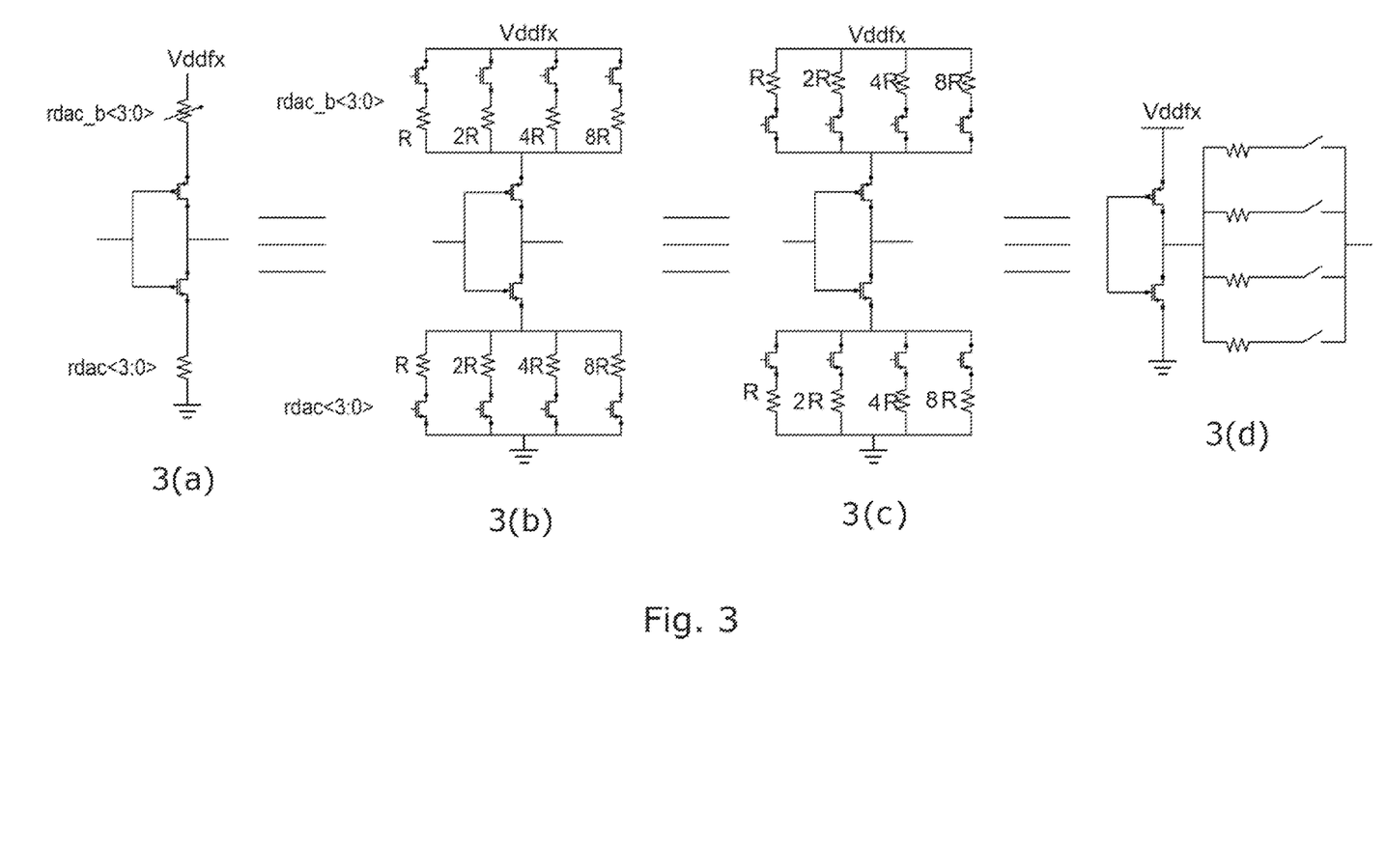

Equivalent circuits for the first stage 101 are shown in FIG. 3. While shown in FIG. 3 as a four-bit resistive digital to analog converter cell, it will be appreciated that circuit elements are readily repeatable to expand the resistive DAC cell.

In a first configuration, there is provided a first stage, 101. The first stage 101 includes a first field effect transistor, FET, 201. A second FET, 202, is also provided. The drain of the first FET is coupled to the drain of the second FET. The output 104 from the first stage, 101 is coupled to the drain of the first FET and the drain of the second FET. The gates of the first and second FET are coupled together and to an input 103. The first and second FET form an inverter. A first resistor 203 is coupled to the source of the first FET 201. The first resistor 203 is coupled in series between a first voltage level, Vddfx, provided by a first voltage input (not shown), and the source of the first FET, 201. The first resistor 203 may be a variable resistor. A second resistor, 204 is coupled to the source of the second FET. The second resistor 204 is coupled in series between the source of the second FET, 202, and a second voltage level, Vssfx. The second voltage level is provided at a second voltage input. The first FET is a pFET and the second FET is a nFET.

In a second equivalent configuration, shown in 3(b), the first resistor 203 is depicted as a 4-stage binary weighted resistive ladder or bank. The inverter comprising the first FET 201 and the second FET 202 is the same as that described in relation to 3(a). The weighted resistors have values which are multiples of two. The resistor in the most significant bit position has the value R, the next has the value 2R, etc. It will be appreciated that this can be extended to $2^N$, where N is the number of bits (in this case 4). Each resistor is coupled to a switching FET for switching in response to the respective digital input. In the configuration shown in 3(b) the source of each switching FET is coupled to Vdd (Vddfx). The drain of the switching FET is coupled to the respective resistor in the ladder. Rdac[3:0] is provided to the gate. It will be appreciated that rdac_b as shown in FIG. 3 is an inversion of rdac[3:0].

Similarly, the second resistor 204 is depicted with a 4-stage binary weighted resistive ladder or bank. The weighted resistors have values which are multiples of two. The resistor in the most significant bit position has the value R, the next has the value 2R, etc. It will be appreciated that this can be extended to $2^N$. Each resistor is coupled to a switching FET for switching between binary 1 and 0. In the configuration shown in 3(b) the source of each switching FET is coupled to ground. The drain of the switching FET is coupled to the respective resistor in the ladder. Rdac[3:0] is provided to the gate. It will be appreciated that rdac_b as shown in FIG. 3 is an inversion of rdac[3:0].

The configuration shown in 3(c) provides an alternative equivalent arrangement where the position of the resistors and the switching transistors are switched. The first resistor 203 is depicted by a resistive ladder, where the resistor is coupled between Vdd and the source of its respective switching transistor. Similarly the second resistor is depicted by a resistive ladder where the resistor element is positioned between the source of the respective switching transistor and ground. As with the configurations of 3b, the weighted resistors have values which are multiples of two. The resistor in the most significant bit position has the value R, the next has the value 2R, etc. It will be appreciated that this can be extended to $2^N$, where N is the number of bits (in this case 4).

The equivalent circuit of 3(d) positions the resistive ladder at the output of the inverter circuit formed by the first FET 201 and the second FET 202. As with the equivalent circuits of 3(b) and 3(c), the resistors are weighted resistors having values which are multiples of two. The resistor in the most significant bit position has the value R, the next has the value 2R, etc. It will be appreciated that this can be extended to $2^N$, where N is the number of bits (in this case 4).

Figure 4:
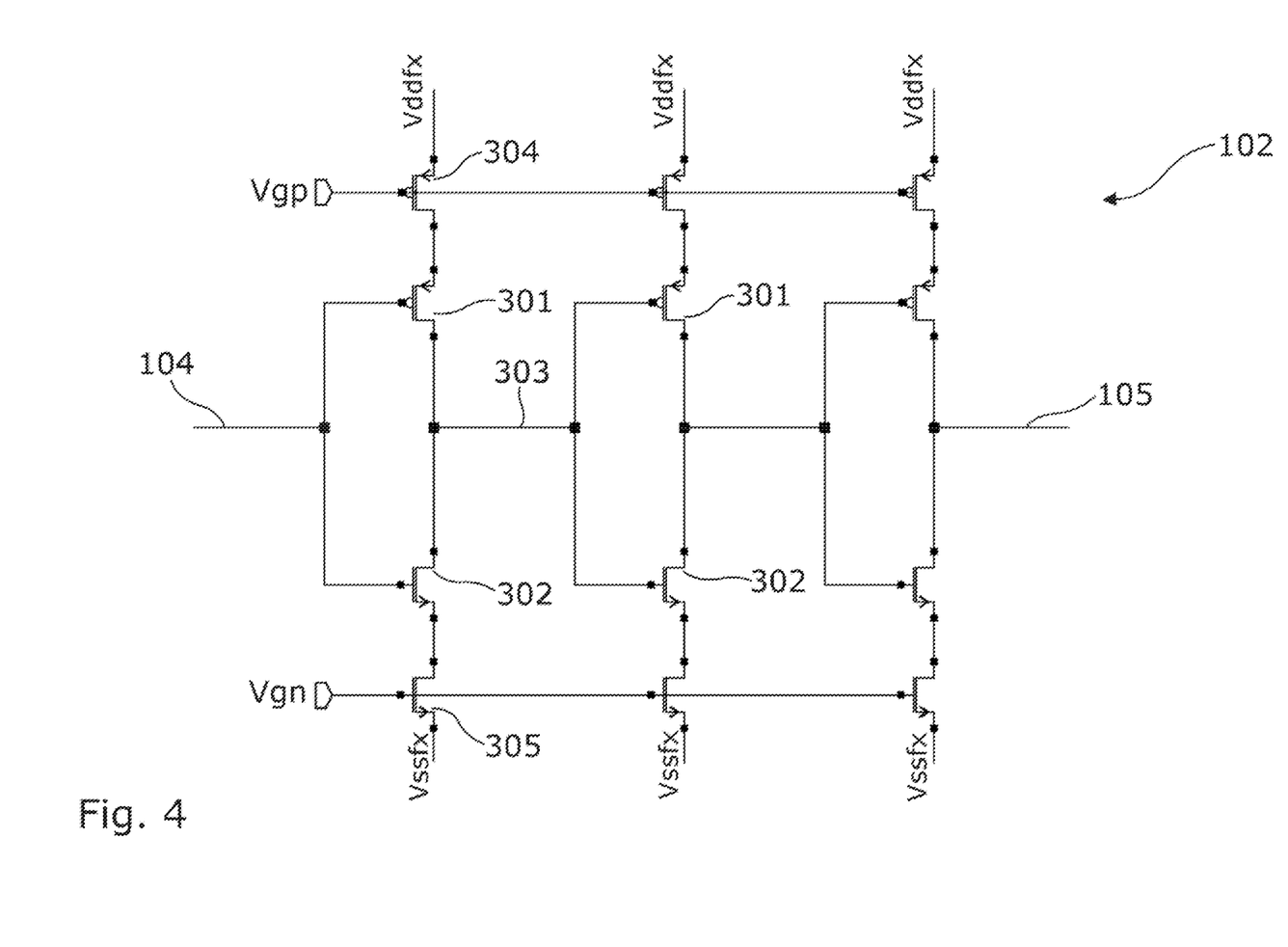
FIG. 4 is a circuit diagram of an example second stage of a hybrid delay cell in accordance with the present invention.

An exemplary configuration of the second stage 102 is shown in FIG. 4. The second stage comprises n sections. The n sections are serially coupled. In one configuration n is equal to three however, it will be appreciated that n is not restricted as such, and may also be greater than or less than three. The value n is chosen to optimize the performance of the second stage.

Each of the n sections includes a third FET 301, and a fourth FET 302. A drain of the third FET 301 is coupled to a drain of the fourth FET 302 and to an output 303 of the section. A gate of the third FET 301 is coupled to a gate of the fourth FET 302 and to an input of the section. Each of the n sections further includes a fifth FET, 304. A drain of the fifth FET 304 is coupled to a source of the third FET 301. The source of the fifth FET 3040 is coupled to the first voltage level, Vddfx. The gate of the fifth FET is coupled to a third voltage level, Vgp. The third voltage level is provided at a third voltage input. This third voltage level, Vgp may in one configuration, be in the range of 0.25V to 0.35V below Vddfx (supply voltage level).

A fourth voltage input is also provided. This fourth voltage input supplies the fourth voltage at a fourth voltage level. The fourth voltage level in one configuration is 0.25V to 0.35V above ground level. This fourth voltage is shown in FIG. 4 as Vgn Each of the n sections further comprises a sixth FET, 305. The drain of the sixth FET 305 is coupled to a source of the fourth FET 302 and a source of the sixth FET 305 is coupled to the second voltage level, Vssfx. A gate of the sixth FET 305 is coupled to the fourth voltage level.

In one configuration the third FET 301 and the fifth FET 304 are pFET and the fourth FET 302 and the sixth FET 305 are nFET.

The output of the second stage 105 is coupled to the output of the nth section of the n sections. The input to the second stage is the input to the first section of the n sections. The n sections of the second are serially coupled such that the output of one stage is the input to the following stage.

Figure 5:
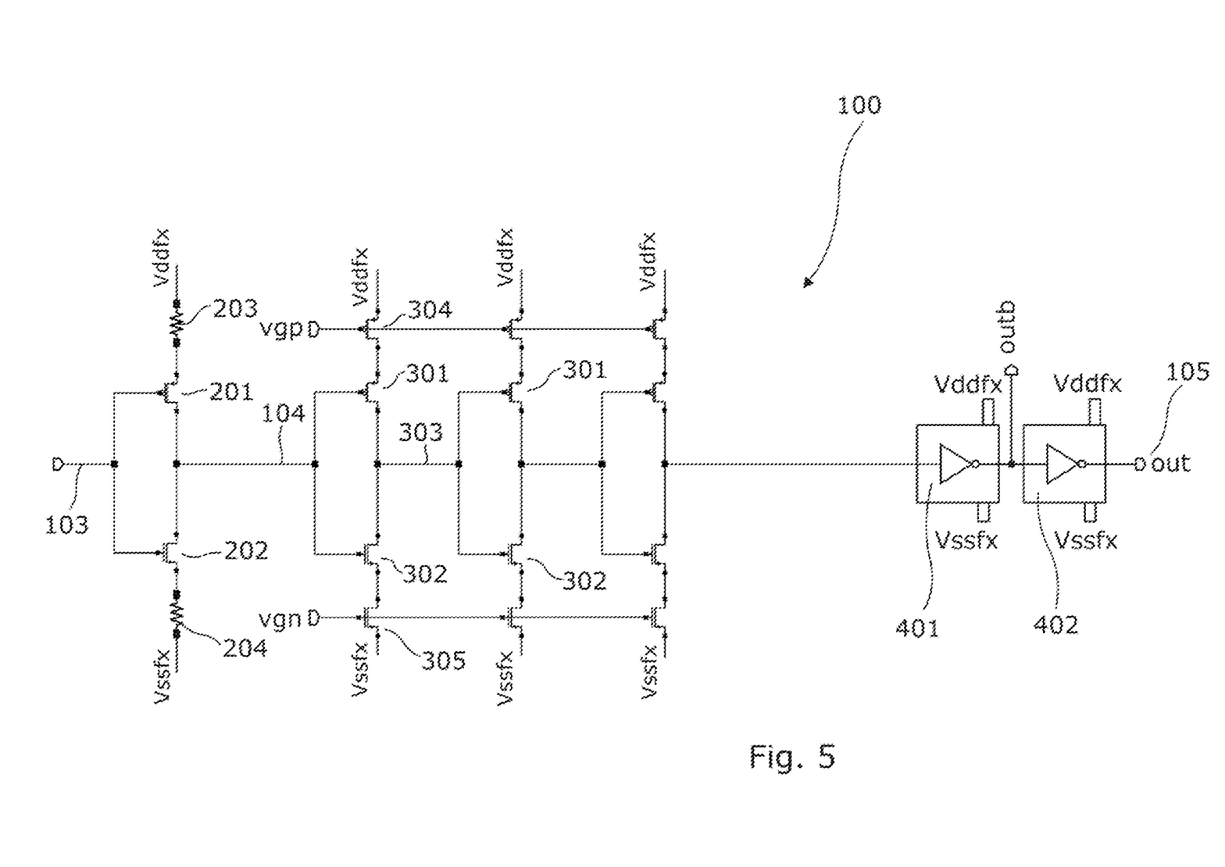
FIG. 5 is a circuit diagram of one example of a hybrid delay cell in accordance with the present invention.

FIG. 5 provides an example of the delay cell comprising the first stage, 101 and the second stage where the first and second stage are serially coupled.

The first stage, 101 comprises a first FET, 201. A second FET, 202, is also provided. The drain of the first FET is coupled to the drain of the second FET. The output 104 from the first stage, 101 is coupled to the drain of the first FET 201 and the drain of the second FET 202. The gates of the first FET 201 and second FET 202 are coupled together and to an input 103. The first and second FET form an inverter. A first resistor 203 is coupled to the source of the first FET 201. The first resistor 203 is coupled in series between a first voltage level, Vddfx, provided by a first voltage input (not shown), and the source of the first FET, 201. The first resistor 203 is a variable resistor. A second resistor, 204 is coupled to the source of the second FET. The second resistor 204 is coupled in series between the source of the second FET, 202, and a second voltage level, Vssfx. The second voltage level is provided at a second voltage input. The first FET is a pFET and the second FET is a nFET. The second stage comprises n sections. The n sections are serially coupled. In one configuration n is equal to three however, it will be appreciated that n is not restricted as such, and may also be greater than or less than three. The value n is chosen to optimize the performance of the second stage.

In one configuration Vssfx may be ground or 0V. Vddfx is a supply voltage and is variable depending on the relevant process technology used in the manufacture of the delay cell. For example for 6 nm to 14 nm processes Vddfx may be in the range of 0.7V to 0.9V.

The second stage comprises n sections. Each of the n sections includes a third FET 301, and a fourth FET 302. A drain of the third FET 301 is coupled to a drain of the fourth FET 302 and to an output 303 of the section. A gate of the third FET 301 is coupled to a gate of the fourth FET 302 and to an input of the section. Each of the n sections further includes a fifth FET, 304. A drain of the fifth FET 304 is coupled to a source of the third FET 301. The source of the fifth FET 304 is coupled to the first voltage level, Vddfx. The gate of the fifth FET is coupled to a third voltage level, Vgp. The third voltage level is provided at a third voltage input. This third voltage level, Vgp may in one configuration, be in the range of 0.25V to 0.35V below Vddfx (supply voltage level).

A fourth voltage input is also provided. This fourth voltage input supplies the fourth voltage at a fourth voltage level. The fourth voltage level in one configuration is 0.25V to 0.35V above ground level. This fourth voltage is shown in FIG. 5 as Vgn Each of the n sections further comprises a sixth FET, 305. The drain of the sixth FET 305 is coupled to a source of the fourth FET 302 and a source of the sixth FET 305 is coupled to the second voltage level, Vssfx. A gate of the sixth FET 305 is coupled to the fourth voltage level, Vgn.

In one configuration the third FET 301 and the fifth FET 304 are pFET and the fourth FET 302 and the sixth FET 305 are nFET.

In one configuration, Vssfx may be ground or 0V. Vddfx is a supply voltage and is variable depending on the relevant process technology used in the manufacture of the delay cell. For example for 6 nm to 14 nm processes Vddfx may be in the range of 0.7V to 0.9V.

In the configuration of FIG. 5 a first inverter 401 is coupled to the output of the second stage providing a first output of the delay cell. A second inverter 402 serially coupled to the first inverter provides a second output of the delay cell. The first and second inverters are coupled between the supply voltage, Vddfx and the ground voltage Vssfx.

Figure 6:
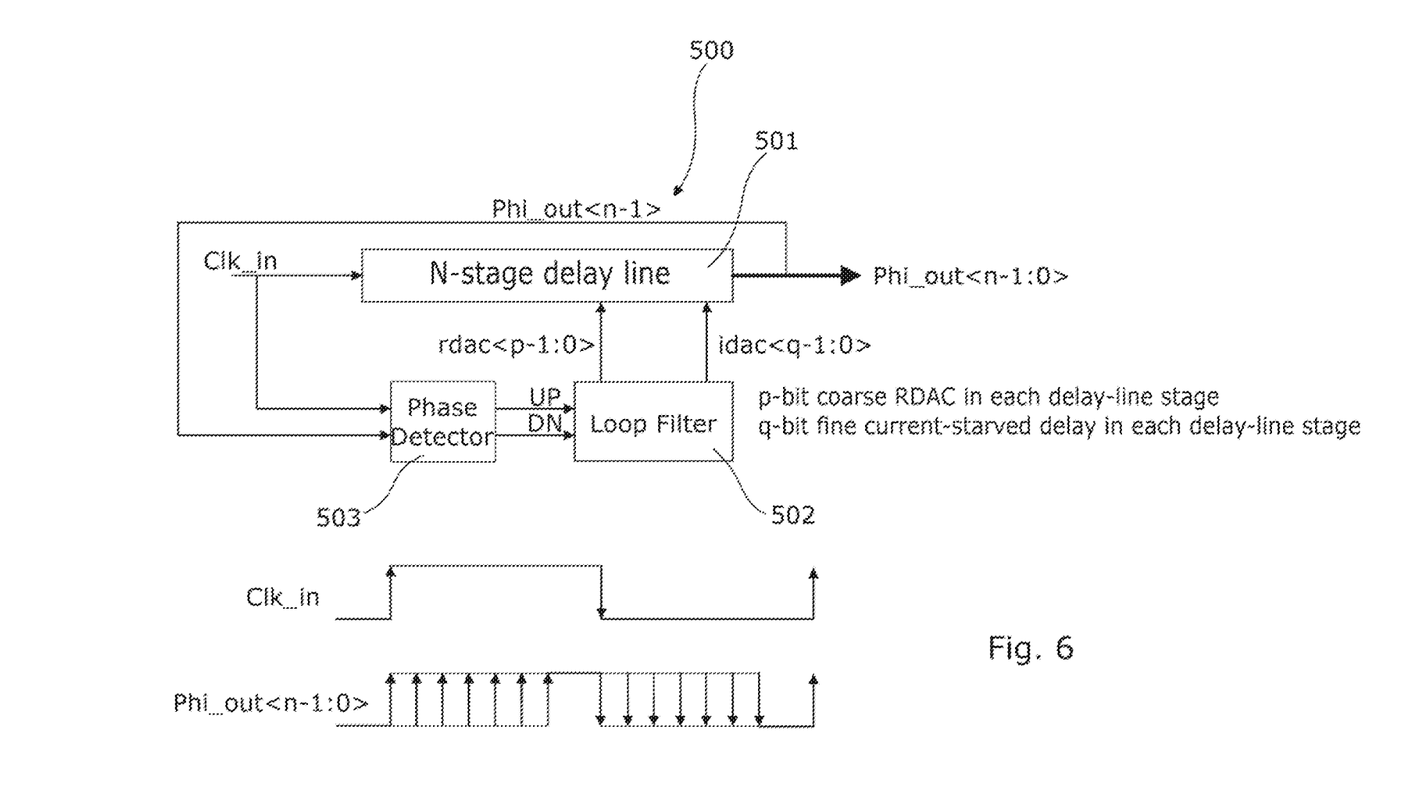
FIG. 6 is a representation of a delay locked loop incorporating a N stage delay line in one implementation of the present invention.

An example circuit for a delay locked loop (DLL) 500 incorporating a N-stage delay line 501 is shown in FIG. 6. It will be appreciated that a DLL of the configuration shown in FIG. 6 may have applications in DLL based serializer/deserializer (SerDes), DLL based clock multipliers, time to digital converters or the like.

Each delay stage in the N-stage delay line in the configuration of FIG. 6, includes a p-bit first stage, e.g., p-bit coarse DAC (first stage) in each delay line stage and a q-bit fine current-starved delay element (second stage) in each delay line stage. The first and second stages of FIG. 6 may be implemented using the cell configuration of FIGS. 2, 3, 4 and 5.

The input to the DLL of FIG. 6 is the input clock Clk_in. The input to the N stage delay line is shown as Clk_in and the output from the N-stage delay line is a phase shifted output clock signal, Phi_out having multiple phases spanning one clock generation period. The phase detector 503 is configured to sense the phase difference between the output of the N-stage delay line and the input clock, Clk_in. The loop filter 502 controls the N-stage delay line according to the sensed phase difference. The first stage may be implemented in accordance with any of the configurations shown in FIG. 2 or FIG. 3 where N=p in the resistive ladders of the equivalent circuits of FIG. 3.

The hybrid combination proposed herein provides lower jitter than a conventional current starved delay cell at comparable power in a comparable process. For example in a 7 nm lithography process, at 250 uA in a 10 Gbps serializer, it is anticipated that the present combination provides approximately 3 times less jitter than a current starved delay cell at comparable power. While a 7 nm lithography process is provided as an example, it will be appreciated that the topology for a delay cell provided herein is applicable to other processes.

Figure 7:
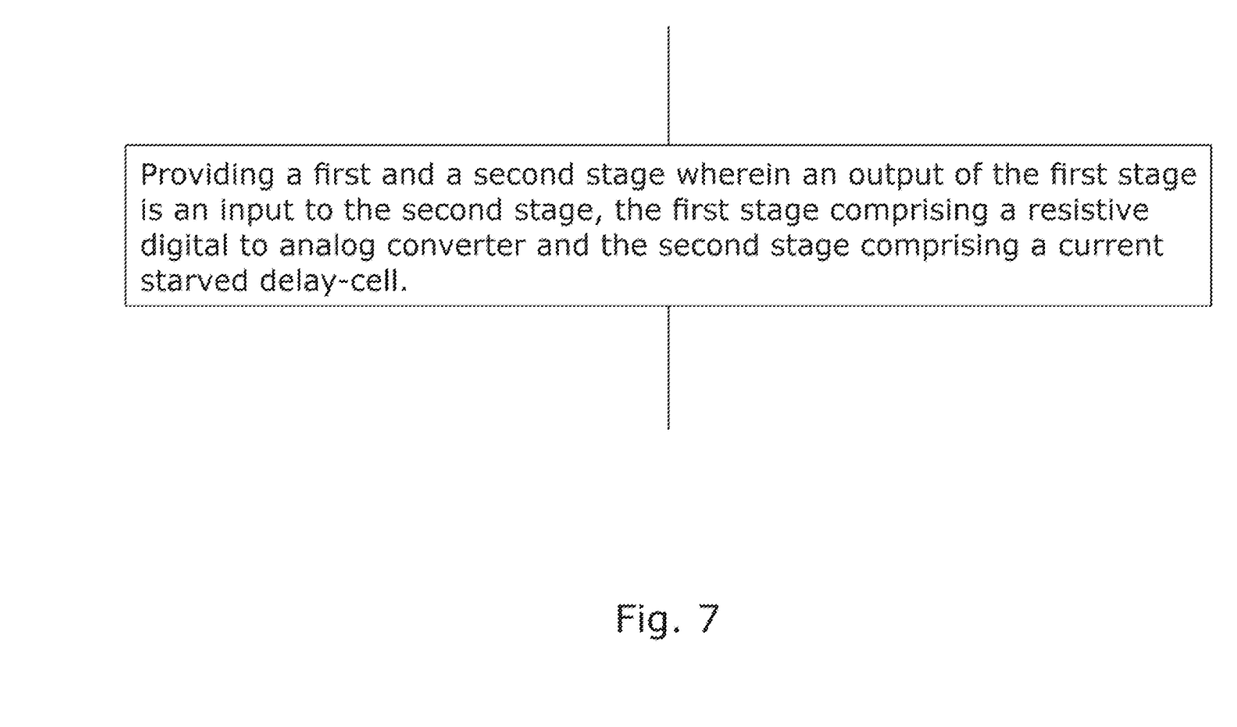
FIG. 7 is a flow diagram of one example of a method in accordance with the present application.

As shown in FIG. 7, there is also provided herein a method of providing a delay cell for use in a delay locked loop, DLL based serial link, comprising: providing a first stage and a second stage, wherein an output of the first stage is an input to the second stage, the first stage comprising a resistive digital to analog converter and the second stage comprising a current starved delay-cell.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A delay cell for a delay locked loop, DLL, based serial link, comprising:
    a first stage and a second stage, wherein an output of the first stage is an input to the second stage, the first stage comprising a resistive digital to analog converter, R-DAC and the second stage comprising a current starved delay-cell.

2. The delay cell according to claim 1, wherein the first stage comprises a first field effect transistor, FET, and a second field effect transistor, FET and wherein a drain of the first FET is coupled to a drain of the second FET, and wherein a gate of the first FET is coupled to a gate of the second FET and to the input.

3. The delay cell according to claim 2, further comprising a first resistor coupled in series between a first voltage level and a source of the first FET and a second resistor coupled in series between a source of the second FET and a second voltage level.

4. The delay cell according to claim 2, wherein the first FET is a pFET and the second FET is a nFET.

5. The delay cell according to claim 1, wherein the second stage comprises n sections coupled in series, each section comprising:
    a third field effect transistor, FET, and
    a fourth field effect transistor, FET, wherein a drain of the third FET is coupled to a drain of the fourth FET and to an output of the section, and wherein a gate of the third FET is coupled to a gate of the fourth FET and to an input of the section.

6. The delay cell according to claim 5, wherein the second stage further comprises a fifth field effect transistor, FET, wherein a drain of the fifth FET is coupled to a source of the third FET, wherein a source of the fifth FET is coupled to a first voltage level and wherein a gate of the fifth FET is coupled to a third voltage level.

7. The delay cell according to claim 6, wherein the second stage further comprises a sixth field effect transistor, FET, wherein a drain of the sixth FET is coupled to a source of the fourth FET, wherein a source of the sixth FET is coupled to a second voltage level and wherein a gate of the sixth FET is coupled to a fourth voltage level.

8. The delay cell according to claim 7, wherein the third FET and the fifth FET are pFET and the fourth FET and sixth FET are nFET.

9. The delay cell according to claim 5, wherein n is greater than or equal to 3.

10. The delay cell according to claim 5, wherein an output of the second stage is coupled to the output of a nth section of the n sections and the input to the second stage is coupled to the input of a first section of the n sections.

11. The delay cell according to claim 1, further comprising an inverter coupled to an output of the second stage.

12. The delay cell according to claim 1, manufactured in accordance with a 7 nanometer lithography process.

13. A method of providing a delay cell for use in a delay locked loop, DLL based serial link, comprising:
    providing a first stage and a second stage, wherein an output of the first stage is an input to the second stage, the first stage comprising a resistive digital to analog converter and the second stage comprising a current starved delay-cell.

14. The method according to claim 13, wherein the first stage comprises a first field effect transistor, FET, and a second field effect transistor, FET and wherein a drain of the first FET is coupled to a drain of the second FET, and wherein a gate of the first FET is coupled to a gate of the second FET and to the input.

15. The method according to claim 14, further comprising coupling a first resistor in series between a first voltage level and a source of the first FET and a second resistor coupled in series between a source of the second FET and a second voltage level.

16. The method according to claim 14, wherein the first FET is a pFET and the second FET is a nFET.

17. The method according to claim 13, wherein the second stage comprises n sections coupled in series, each section comprising:
    a third field effect transistor, FET, and
    a fourth field effect transistor, FET, wherein a drain of the third FET is coupled to a drain of the fourth FET and to an output of the section, and wherein a gate of the third FET is coupled to a gate of the fourth FET and to an input of the section.

18. The method according to claim 17, wherein the second stage further comprises a fifth field effect transistor, FET, wherein a drain of the fifth FET is coupled to a source of the third FET, wherein a source of the fifth FET is coupled to a first voltage level and wherein a gate of the fifth FET is coupled to a third voltage level.

19. The method according to claim 18, wherein the second stage further comprises a sixth field effect transistor, FET, wherein a drain of the sixth FET is coupled to a source of the fourth FET, wherein a source of the sixth FET is coupled to a second voltage level and wherein a gate of the sixth FET is coupled to a fourth voltage level.

20. The method according to claim 19, wherein the third FET and the fifth FET are pFET and the fourth FET and sixth FET are nFET.

21. The method according to claim 17, wherein n is greater than or equal to 3.

22. The method according to claim 17, wherein each section of the n sections are serially coupled such that the input of the second stage is the input to a first section of the n sections and the output of the second stage is the output of a final section of the n sections.

23. The method of claim 13, further comprising coupling an inverter to the output of the second stage.

24. A delay-locked loop, DLL, comprising a plurality of delay cells comprising:
    a first stage and a second stage, wherein an output of the first stage is an input to the second stage, the first stage comprising a resistive digital to analog converter, R-DAC and the second stage comprising a current starved delay-cell.

25. The DLL according to claim 24, wherein the first stage comprises a first field effect transistor, FET, and a second field effect transistor, FET and wherein a drain of the first FET is coupled to a drain of the second FET, and wherein a gate of the first FET is coupled to a gate of the second FET and to the input.

26. The DLL according to claim 25, further comprising a first resistor coupled in series between a first voltage level and a source of the first FET and a second resistor coupled in series between a source of the second FET and a second voltage level.

27. The DLL according to claim 24, wherein the second stage comprises n sections coupled in series, each section comprising:
    a third field effect transistor, FET, and
    a fourth field effect transistor, FET, wherein a drain of the third FED is coupled to a drain of the fourth FET and to an output of the section, and wherein a gate of the third FET is coupled to a gate of the fourth FET and to an input of the section.

28. The DLL according to claim 27, wherein the second stage further comprises a fifth FET, wherein a drain of the fifth FET is coupled to a source of the third FET, wherein a source of the fifth FET is coupled to a first voltage level and wherein a gate of the fifth FET is coupled to a third voltage level.

29. The DLL according to claim 28, wherein the second stage further comprises a sixth FET, wherein a drain of the sixth FET is coupled to a source of the fourth FET, wherein a source of the sixth FET is coupled to a second voltage level and wherein a gate of the sixth FET is coupled to a fourth voltage level.

30. A serial link comprising the delay-locked loop, DLL, according to claim 24.

* * * * *